Feb. 9, 1971 SHIGETOKI SUGIMOTO ET AL 3,562,672
MICROWAVE PULSE-MODULATING DEVICE
Filed Oct. 15, 1968 2 Sheets-Sheet 1

INVENTORS
SHIGETOKI SUGIMOTO
TADAHIKO SUGIURA
BY
Hopgood & Calimafde
ATTORNEYS

MICROWAVE PULSE-MODULATING DEVICE

Filed Oct. 15, 1968 2 Sheets-Sheet 2

INVENTORS
SHIGETOKI SUGIMOTO
TADAHIKO SUGIURA

BY

Hopgood & Calimafde

ATTORNEYS

United States Patent Office 3,562,672

Patented Feb. 9, 1971

3,562,672
MICROWAVE PULSE-MODULATING DEVICE

Shigetoki Sugimoto and Tadahiko Sugiura, Tokyo, Japan, assignors to Nippon Electric Company, Limited, Tokyo-to Japan Filed Oct. 15, 1968, Ser. No. 767,651
Claims priority, application Japan, Nov. 21, 1967, 42/74,898
Int. Cl. H03c *1/14;* H03k *3/31*
U.S. Cl. 332—9 1 Claim

ABSTRACT OF THE DISCLOSURE

A microwave pulse modulator is described which utilizes a Gunn diode in electromagnetic variable attenuation relationship with a source of microwave energy and which is biased by a modulation voltage which varies between a maximum and a minimum value with the maximum level being chosen larger than the threshold voltage of the diode and the minimum level being chosen below the threshold level.

This invention relates to a microwave pulse-modulating device and, more particularly, to a modulating device of the kind employing a Gunn diode as the pulse-switching element.

Various reports have been made on the microwave ultra-high-speed modulating device. Most of these devices employ the semi-conductor diode (referred to as diode in the following) as the switching element. In such a device, a microwave signal transmitted through a microwave circuit (or reflected from it) is modulated in response to the variation of the bias voltage applied to the diode. The modulation is based on the resonance phenomenon occurring in the microwave circuit and the diode coupled to the microwave circuit. A varactor diode has been most frequently used as the switching element. Since the varactor diode is a passive element, its use inevitably incurs an insertion loss. On the other hand, a reduction in the insertion loss of a varactor diode unavoidably causes a decrease in the modulation ratio, since the modulation ratio varies with insertion loss, i.e. an increase in the modulation ratio results in an increased insertion loss.

When a varactor diode is used for the modulation of microwaves in the so-called millimeter-wave region, a modulator having satisfactory pulse-modulation characteristics can not be realized, because a diode having cut-off frequency more than five times as high as the working frequency is not easily obtained. Deterioration of the pulse-modulation characteristics of the varactor diode in the millimeter-wave region is especially noticeable when the input microwave level exceeds 0 dbm. (1 mw.).

It is therefore the main object of this invention to provide a microwave-pulse modulator for use in the millimeter-wave region.

It is a further object of this invention to provide a millimeter-wave microwave pulse modulator having an extremely small insertion loss even with the pulse modulation of relatively large powers in excess of 10 dbm. or 10 milliwatts.

It is still further an object of this invention to provide a millimeter wave pulse-modulator with amplifying characteristics.

Figure 1:
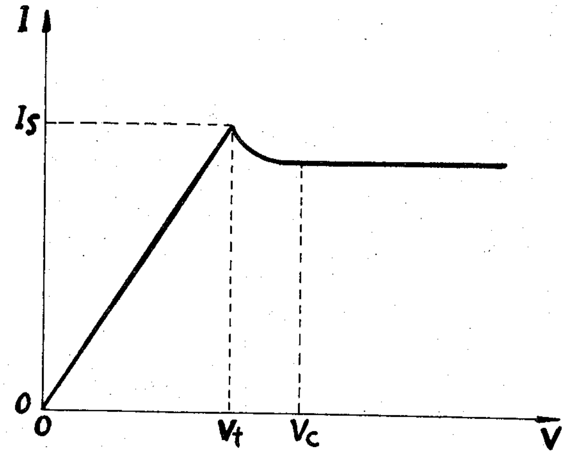
Figure 3:
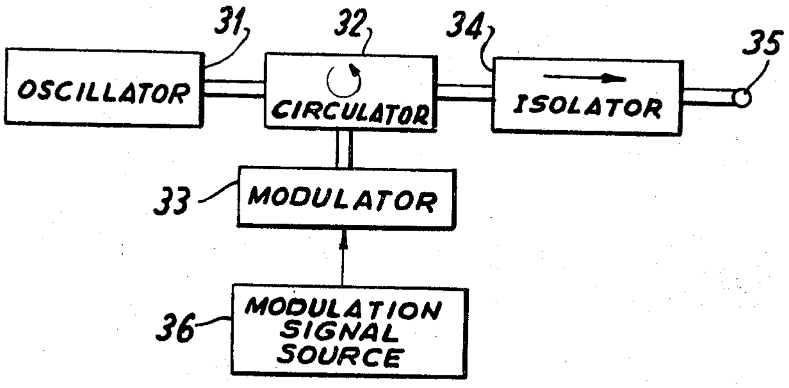
Figure 4:
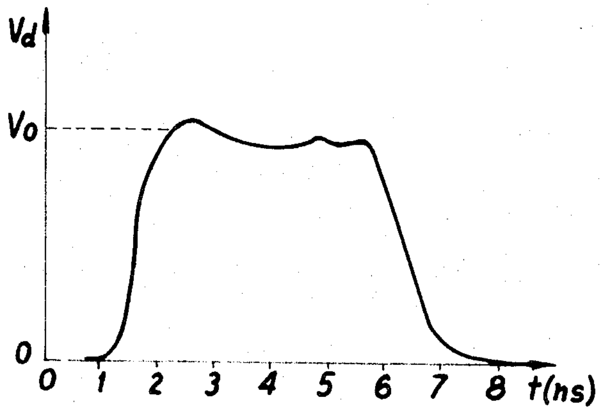
Figures 2A, 2B:
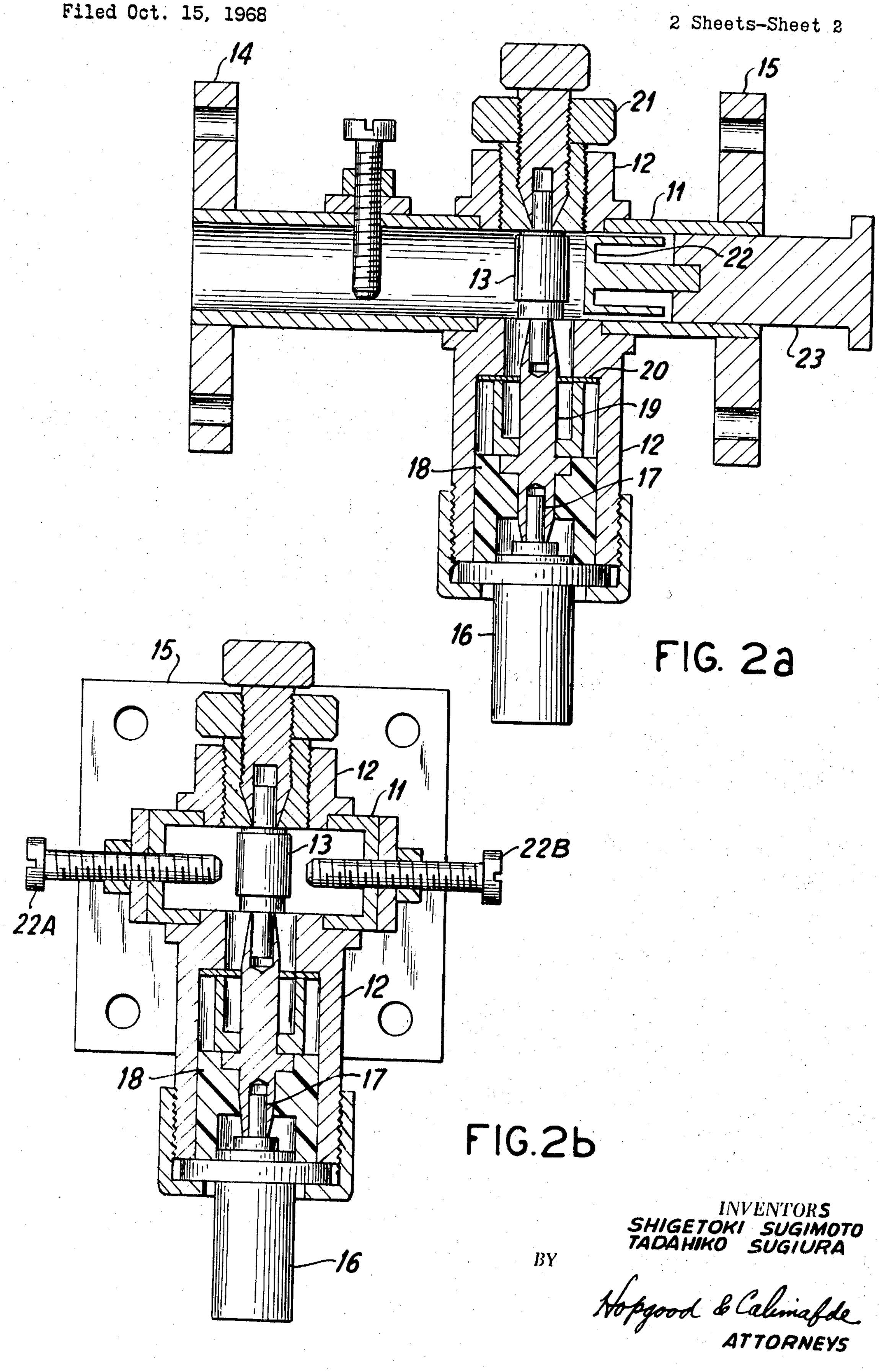

The above-mentioned and other features and objects of this invention and the manner of attaining them will be understood by reference to the following description of embodiments of the invention, taken in conjunction with the accompanying drawings, wherein:

FIG. 1 is a current-voltage characteristic curve of a Gunn diode employed in a device of the invention;

FIGS. 2*a* and 2*b*, respectively, are longitudinal and axial cross-sectional views of a diode mount which constitutes a principal portion of a modulator according to the invention;

FIG. 3 is a block diagram of a microwave modulator comprising the diode mount of FIG. 2 as the pulse-modulating element; and FIG. 4 is an example of a detected waveform of the output of the microwave modulator of FIG. 3.

Briefly stated, our invention contemplates using a Gunn diode as a switching element in a microwave pulse modulator.

As is shown in FIG. 1, the current vs. voltage characteristic curve of a Gunn diode has a linear slope as the bias voltage is increased from 0 volt up to a threshold value $V_t$. When the bias voltage is increased beyond the value $V_t$, the current I takes a saturated value $I_s$. When the voltage is further increased, the current I decreases. Finally, the current I approaches a constant value in the region where the voltage V is higher than $V_c$. By operating a Gunn diode with a microwave circuit and varying the bias voltage on the diode between $V=0$ and a value higher than the threshold value $V_t$ alternate absorption and amplification of microwaves is obtained.

Referring to FIGS. 2*a* and 2*b* there are shown the longitudinal and axial cross-sectional views of a diode mount constituting the principal portion of a microwave pulse-modulator according to the invention. The diode mount comprises a waveguide 11, a diode-holder 12 of circular cross-section mounted on the waveguide 11 in the direction perpendicular to the E-plane of the waveguide 11, and a Gunn diode 13 disposed at a cross-point of the center of the axial direction of the holder 12 and the center of the cross-section of the waveguide 11. The flanges 14 and 15 are provided at input and output ends of the waveguide 11 to connect it to other devices. A connector 16 for receiving the modulating signal to the diode 13 is attached to the lower edge of the holder 12. The top of the axial conductor of the connector 16 is in contact with a connecting bar 19 supported with a supporting ring 18 of Teflon. To prevent a leak of the microwave power passing through the waveguide 11, a high frequency choke portion is provided around the connecting bar 19, the upper end of which is in contact with the inner wall of the holder 12 through an apertured insulator ring disc 20. The upper electrode of the diode 13 is electrically connected directly to the holder 12 and waveguide 11 through a screw 21. In order to utilize this diode switch as that of the reflection type, a movable short-plate 22 is installed within the waveguide 11. In addition, adjusting bars 22A and 22B for attaining the impedance matching of the diode and microwave circuit are attached to the waveguide 11 in a directional perpendicular to the H-plane of the waveguide 11. Also, a short-plate adjusting member 23 for tuning is installed in a direction perpendicular to the E-plane of the waveguide 11. The number of the adjusting bars 22A and 22B may be increased if necessary.

A microwave supplied from a microwave source (not shown) through the flange 14 is modulated by a pulse signal applied to the Gunn diode 13 through connector 16. The modulated microwave signal, after reflection by the shorting plate 22, is made available through the flange 14.

Although this diode mount itself is not novel, it has been illustrated because it brought about the salient technical advantage of the invention.

In the operation of the diode mount of FIGS. 2*a* and 2*b*, the bias voltage levels for the Gunn diode are selected to take advantage of the incremental negative resistance characteristic observed in FIG. 1 for bias voltages exceeding $V_t$. Stated more specifically, the bias voltage is varied from about zero volts to a value higher than the threshold value $V_t$. Since the impedance presented by the diode hardly varies (even for large microwave powers) for the region where the diode current I is proportional to the bias voltage V, a micowave modulator having excellent power characteristics is obtained.

Referring to FIG. 3 which is a block diagram of a microwave modulator comprising as its principal constituent the diode mount of FIG. 2, the output of an oscillator 31 is applied to a modulator 33 through a circulator 32. The modulator 33 is a diode mount as shown in FIG. 2. The pulse-modulation of a microwave signal is performed in the modulator 33, to which the modulating signal is applied through a modulating signal source 36. The microwave power pulse-modulated in the modulator 33 and reflected from it is transmitted to an output terminal 35 again through the circulator 32. To prevent the reflection of the microwave due to the circulator 32 and the output terminal 35, an isolator 34 may be inserted between the circulator 32 and the terminal 35.

In an experiment, the bias voltage of the Gunn diode was set at 0 v. when the modulating signal is absent. Also, the movable short-plate 22 of the modulator 33 is adjusted to a position where the reflected power existing between the modulator 33 and circulator 32 is minimized. This position adjustment is easily performed by monitoring the output level of the microwave at output terminal 35. No adjustment of the circuit is needed when the modulating signal is present.

The envelope of the modulated output is observed by subjecting the modulated output to envelope-detection at a detector connected to the output terminal 35. The detected output waveform is as shown in FIG. 4. This envelope waveform was observed at 12 gHz, and 30 mw. In the drawing, the value $V_0$ indicates an output voltage at which the attenuation of the modulator 33 is 0 db.

In the FIG. 4, $V_0$ represents an effective minimum or zero attenuation level by the modulator and corresponds to the presence of a modulating input signal. Since the output is smaller by a ratio of more than 25 db. when the modulating input is absent, a modulation ratio of greater than 25 db. is obtained. If one considers the peak value for $V_d$ which arises at $t$=2.5 nanoseconds, the modulation ratio would be still greater than 25 db. Since the rise time and fall-off times of the detected waveform are less than 1 nanosecond and approximately 1 nanosecond, respectively, this modulator is particularly applicable to ultra-high speed pulse communication.

As can be understood from the experimental result described above, the small insertion loss (in most favorable case, insertion loss bringing about an amplifying function) and the large modulation ratio can be obtained by means of the microwave modulator according to the invention. The efficient pulse modulation of microwaves is thus realized. In the described embodiment the diode mount is of the reflected type modulator structure. It will be apparent to engineers in this technical field that the same performance can be attained by employing modulators of the transmission type.

While the principles of the invention have been described in connection with specific apparatus, it is to be clearly understood that this description is made only by way of example and not as a limitation to the scope of the invention as set forth in the objects thereof and in the accompanying claim.

We claim:

1. In a microwave pulse modulator including a microwave circuit for generating a continuous microwave signal, and a diode electromagnetically coupled to said microwave circuit, the improvement which comprises, said diode being a Gunn diode, and means for applying a switching signal having maximum and minimum values to said Gunn diode, one of said values exceeding the threshold value of the current-voltage characteristic of said Gunn diode, whereby said microwave signal is on-off modulated in response to the respective levels of said switching signal.

References Cited

UNITED STATES PATENTS

| | | | |
|---|---|---|---|
| 3,299,372 | 1/1967 | Saeki et al. | 332—52X |
| 3,365,583 | 1/1968 | Guan | 331—107(GUX) |
| 3,435,307 | 3/1969 | Landauer | 331—107GX |
| 3,437,957 | 4/1969 | Ames | 332—9X |

FOREIGN PATENTS

| | | | |
|---|---|---|---|
| 1,108,372 | 3/1968 | Great Britain | 331—107G |
| 1,143,177 | 4/1967 | France | 331—107G |

ALFRED L. BRODY, Primary Examiner

U.S. Cl. X.R.

307—299; 331—107; 332—52